(12) United States Patent
Shim

(10) Patent No.: US 7,211,889 B2
(45) Date of Patent: May 1, 2007

(54) SEMICONDUCTOR PACKAGE AND METHOD FOR MANUFACTURING THE SAME

(75) Inventor: Jong Bo Shim, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 607 days.

(21) Appl. No.: 10/199,343

(22) Filed: Jul. 19, 2002

(65) Prior Publication Data

US 2003/0030140 A1 Feb. 13, 2003

(30) Foreign Application Priority Data

Aug. 9, 2001 (KR) ........................ 2001-47910

(51) Int. Cl.
*H01L 23/12* (2006.01)

(52) U.S. Cl. ........................ 257/711; 257/710; 257/707; 438/121; 438/122

(58) Field of Classification Search ................. 257/711, 257/710, 707; 438/121, 122
See application file for complete search history.

(56) References Cited

U.S. PATENT DOCUMENTS 6,046,077 A * 4/2000 Baba ........................ 438/127

* cited by examiner

*Primary Examiner*—David L. Talbott
*Assistant Examiner*—Luan Thai
(74) *Attorney, Agent, or Firm*—Harness, Dickey & Pierce, P.L.C.

(57) ABSTRACT

A semiconductor package includes a wiring board, a semiconductor chip flip-chip bonded to the wiring board, an adhesive coated on the wiring board, a stiffener ring attached to the wiring board, and a heat spreader attached to the stiffener ring and the semiconductor chip. The stiffener ring includes a window through which the semiconductor chip is exposed and multiple through holes. A thermal interface material (TIM) coated on the back surface of the semiconductor chip. The stiffener ring is attached to the heat spreader by portions of the adhesive squeezed onto the upper surface of the stiffener ring via the through holes, and the semiconductor chip is attached to the heat spreader by the TIM. A method for manufacturing a semiconductor package includes: flip-chip bonding a semiconductor chip to a wiring board; coating an adhesive on the wiring board; and attaching a stiffener ring to the wiring board. The stiffener ring includes a window through which the semiconductor chip is exposed and through holes. The stiffener ring is attached to a heat spreader by portions of the adhesive squeezed onto the upper surface of the stiffener ring via the through holes, and the semiconductor chip is attached to the heat spreader by the TIM.

9 Claims, 6 Drawing Sheets

SEMICONDUCTOR PACKAGE AND METHOD FOR MANUFACTURING THE SAME

BACKGROUND OF THE INVENTION

1. Field of the Invention

The present invention relates to the field of semiconductor manufacturing and, more particularly to a semiconductor package with a stiffener ring between a heat spreader and a wiring board and a method for manufacturing such a package.

2. Description of the Related Arts

Recent trends in electronic development have been toward light weight, miniaturization, high speed, multi-functionalization, high quality, high reliability, and low production cost. In order to satisfy these pressing demands, a ball grid array (BGA) package was introduced. Compared to a conventional plastic package, the BGA package has advantages of reduced mounting area on a curcuit board and excellent electronic characteristics.

While conventional plastic packages employ a lead frame, the BGA package employs a wiring board. Since external terminals of the BGA package, such as solder balls, can be formed on the entire surface of the wiring board, a high mounting density on an associated circuit board can be achieved. A printed circuit board, a ceramic substrate or a printed circuit tape may be used as the wiring board. Although the electrical connection between the wiring board and the chip was achieved mainly by a wire-bonding method, this connection has been recently achieved by a flip-chip bonding method, thereby improving speed of integrated circuit chips requiring high power and high frequency.

FIGS. 1 and 2 illustrate a semiconductor package 100 having a flip-chip bonded semiconductor chip 10. As shown in FIGS. 1 and 2, the semiconductor chip 10 is flip-chip bonded to the upper surface of a wiring board 20 using electrode bumps 12 (shown in FIG. 2). The flip-chip bonding area between the semiconductor chip 10 and the wiring board 20 is filled with an epoxy resin 30 by an underfilling method. An adhesive 42 is coated on four corners of the upper surface of the wiring board 20. A stiffener ring 50 is attached to the upper surface of the wiring board 20 by the adhesive 42. The stiffener ring 50 has an opening 52 at the center, through which the flip chip bonded semiconductor chip 10 is exposed. An adhesive 44 is coated on four corners of the upper surface of the stiffener ring 50, and a thermal interface material (TIM) 60 is coated on the back surface of the semiconductor chip 10. Then, a heat spreader 70 is attached to the upper surface of the stiffener ring 50 and the back surface of the semiconductor chip 10 by the adhesive 44 and the TIM 60, respectively. Multiple external connection terminals 80 (shown in FIG. 2) such as solder balls are formed on the lower surface of the wiring board 20. The terminals 80 are electrically connected to the semiconductor chip 10 through the wiring board 20.

Herein, the stiffener ring 50, which is attached to the upper surface of the wiring board 20, serves to prevent the warpage of the wiring board 20 and to more firmly attach the heat spreader 70 to the back surface of the semiconductor chip 10. If the heat spreader is attached to the back surface of the semiconductor chip without the stiffener ring, the adhesion strength between the heat spreader and the TIM on the back surface of the semiconductor chip may not be sufficient, and thus the heat spreader may be detached from the back surface of the semiconductor chip. However, in order to interpose the stiffener ring 50 between the wiring board 20 and the heat spreader 70, it is necessary that the adhesives 42 and 44 are respectively coated by two separate steps, that is, a step of coating the adhesive 42 on the upper surface of the wiring board 20, thereby attaching the stiffener ring 50 to the wiring board 20 and a step of coating the adhesive 44 on the upper surface of the stiffener ring 50, thereby attaching the heat spreader 70 to the stiffener ring 50. Therefore, the conventional semiconductor package 100 has a drawback in that the manufacturing process is complicated.

SUMMARY OF THE INVENTION

In accordance with an embodiment of the present invention, a semiconductor package includes a wiring board, a semiconductor chip flip-chip bonded to the wiring board, an adhesive coated on the wiring board, a stiffener ring attached to the wiring board, and a heat spreader attached to the stiffener ring and the semiconductor chip. The stiffener ring includes a window through which the semiconductor chip is exposed and multiple through holes. A thermal interface material (TIM) is coated on the back surface of the semiconductor chip. The stiffener ring is attached to the heat spreader by portions of the adhesive extended through the via holes and onto the upper surface of the stiffener ring, and the semiconductor chip is attached to the heat spreader by the TIM. Further, external connection terminals are formed on the lower surface of the wiring board.

The stiffener ring can have the same thickness as the semiconductor chip, and the adhesive is coated on multiple locations on the upper surface of the wiring board. Then, each of the through holes is formed corresponding to the locations of the adhesive. The through holes are preferably formed along edges of the stiffener ring.

Another embodiment of the present invention provides a method for manufacturing a semiconductor package. The method includes: preparing a wiring board; flip-chip bonding a semiconductor chip to the wiring board; coating an adhesive on the wiring board; and attaching a stiffener ring to the wiring board. The stiffener ring includes: a window through which the semiconductor chip is exposed; and a plurality of through holes. The method further includes: coating a thermal interface material (TIM) on the back surface of the semiconductor chip; attaching a heat spreader to the stiffener ring and the semiconductor chip; and forming external connection terminals on the lower surface of the wiring board. The stiffener ring is attached to the heat spreader by portions of the adhesive squeezed onto the upper surface of the stiffener ring via the through holes, and the semiconductor chip is attached to the heat spreader by the TIM.

The method further includes, after flip-chip bonding of the semiconductor chip, filling a space between the semiconductor chip and the wiring board with a polymeric material.

BRIEF DESCRIPTION OF THE DRAWING

The features and advantages of the present invention will be readily understood with reference to the following detailed description thereof provided in conjunction with the accompanying drawings, wherein like reference numerals designate like structural elements, and, in which.

DETAILED DESCRIPTION

FIGS. 3 to 8 illustrate a process for manufacturing a semiconductor package in accordance with an embodiment of the present invention.

Figure 3:
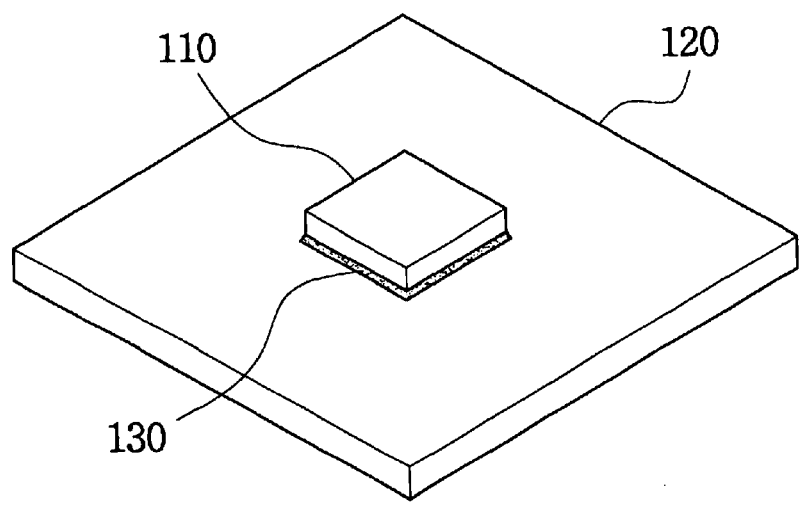
FIG. 3 is a perspective view of a semiconductor chip mounted on a wiring board.

As shown in FIG. 3, the manufacturing process of the semiconductor package of this embodiment starts with preparing a wiring board 120. Herein, the wiring board 120 is a circuit board with a circuit pattern. A printed circuit board, a ceramic substrate, or a printed circuit tape may be used as the wiring board 120. An exemplary thickness of the wiring board 120 is between 0.4 mm and 1.2 mm.

A semiconductor chip 110 is mounted on the upper surface of the wiring board 120. This step of mounting the semiconductor chip 110 includes a step of bonding the semiconductor chip 110 to the wiring board 120 by flip-chip bonding and a step of filling the flip-chip bonding area with an epoxy resin 130. The active surface of the semiconductor chip 110 having electrode pads (112 in FIG. 5) is flux-dipped and mounted on the upper surface of the wiring board 120. The semiconductor chip 110 is flip-chip bonded to the wiring board 120 by a reflow process at the temperature of about 350° C. to 360° C. for approximately 100 seconds. Then, the flip chip bonding area is filled with the epoxy resin 130 by an underfill method and cured at the temperature of about 70° C. to 100° C. for approximately 180 seconds. An exemplary thickness of the semiconductor chip 110 is approximately 720 μm and an exemplary height of the flip-chip bonding area is approximately 80 μm.

Figure 4:
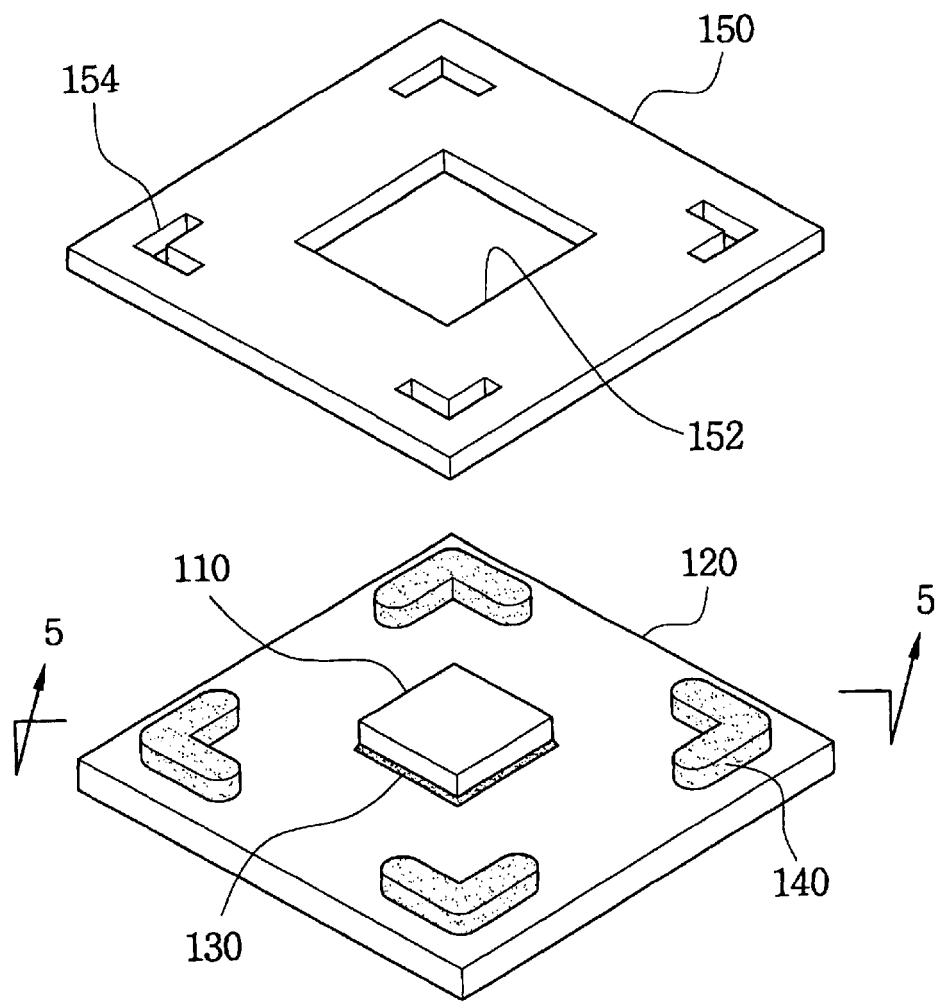
FIG. 4 is a perspective view of the wiring board with associated stiffener ring in accordance with an embodiment of the present invention.
Figure 5:
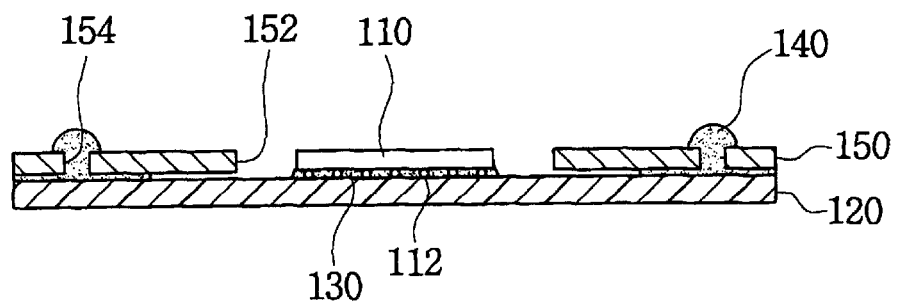
FIG. 5 is a cross-sectional view taken along line 5—5 of FIG. 4.

Then, as shown in FIGS. 4 and 5, a stiffener ring 150 is attached. An adhesive 140 is discontinuously coated on the upper surface of the wiring board 120, and the stiffener ring 150 is attached to the upper surface of the wiring board 120 by the adhesive 140.

Herein, the adhesive 140 is coated in an "L" shape on four corners of the upper surface of the wiring board 120. The adhesive 140 is a nonconductive adhesive such as a thermosetting silicone adhesive or an epoxy adhesive. Preferably, the thermosetting silicone adhesive is used as the adhesive 140. The thermosetting silicone adhesive has an excellent adhesion strength between the wiring board 120 and the stiffener ring 150, and serves as a buffer for absorbing the stresses due to the difference of Coefficient of Thermal Expansion (CTE) between the wiring board 120 and the stiffener ring 150.

The stiffener ring 150 can be a metal plate in a square ring shape and made of a Fe-alloy or a Cu-alloy. The stiffener ring 150 serves to prevent the warpage of the wiring board 120 and to firmly attach heat spreader 170 (FIG. 7) to the back surface of the semiconductor chip 110. The stiffener ring 150 includes an opening 152 at the center, which is bigger than the flip-chip bonded semiconductor chip 110, and through holes 154. The through holes 154 are in a predetermined shape correspondingly to the adhesives 140 on the upper surface of the wiring board 120, for example, in an "L" shape. The through hole 154 has a smaller size than the adhesive 140, so that the adhesive 140 is squeezed into the upper surface of the stiffener ring 150 via the through hole 154 when the stiffener ring 150 is pressed for bonding to the wiring board 120. Then, the stiffener ring 150 is attached to the upper surface of the wiring board 120, thereby exposing the semiconductor chip 110 through the opening 152 of the stiffener ring 150.

In order to attach firmly the heat spreader 170 (FIG. 7) to the upper surface of the stiffener ring 150 and the back surface of the semiconductor chip 110, it is preferable that the upper surface of the stiffener ring 150 is coplanar with the back surface of the semiconductor chip 110. For example, in this embodiment of the present invention, since the height of the semiconductor chip 110 is approximately 800 μm and the thickness of the adhesive 140 is approximately 50 μm to 100 μm, preferably the stiffener ring 150 has a thickness of approximately 700 μm to 750 μm. However, since an adhesive is squeezed onto the upper surface of the stiffener ring 150 and when a thermal interface material 160 (FIG. 6) is formed on the back surface of the semiconductor chip 110, a small difference between levels of the upper surface of the stiffener ring 150 and the back surface of the semiconductor chip 110 can be compensated for by adjusting the thickness of the adhesive or the thermal interface material.

Figure 6:
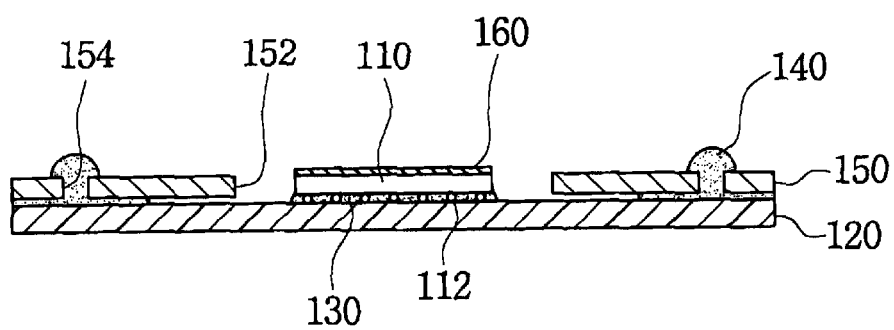
FIG. 6 is a cross-sectional view of the wiring board of FIG. 4 with a thermal interface material (TIM)

As shown in FIG. 6, the thermal interface material (TIM) 160, with an excellent thermal conductivity, is coated on the back surface of the semiconductor chip 110.

Figure 7:
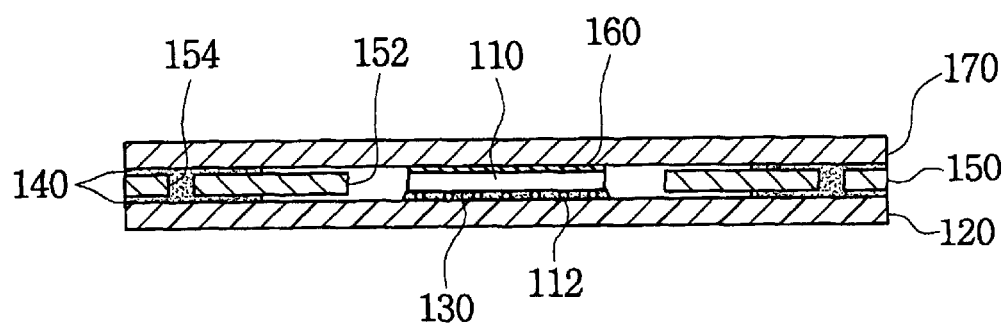
FIG. 7 is a cross-sectional view of the wiring board of FIG. 6 with a heat spreader.

As shown in FIG. 7, a heat spreader 170 is attached to the upper surface of the stiffener ring 150 and the back surface of the semiconductor chip 110. That is, the heat spreader 170 is attached to the adhesive 140 squeezed onto the upper surface of the stiffener ring 150 via the through holes 154 and the TIM 160 on the back surface of the semiconductor chip 110. The heat spreader 170 is made of copper (Cu) or Cu-alloy with excellent thermal conductivity and has a thickness of about 0.5 mm to 1 mm.

Then, the adhesive 140 and the TIM 160 are cured at the temperature of about 100☐ to 150☐ for approximately 1 hour.

Since the adhesive 140, coated on the upper surface of the wiring board 120, is partially squeezed onto the upper surface of the stiffener ring 150 via the through holes 154 by the downward pressing force of the stiffener ring 150 and used to attach the heat spreader 170 to the stiffener ring 150, the manufacturing method according to an embodiment of the present invention can omit the conventional step of coating an adhesive on the upper surface of the stiffener ring.

Figure 1:
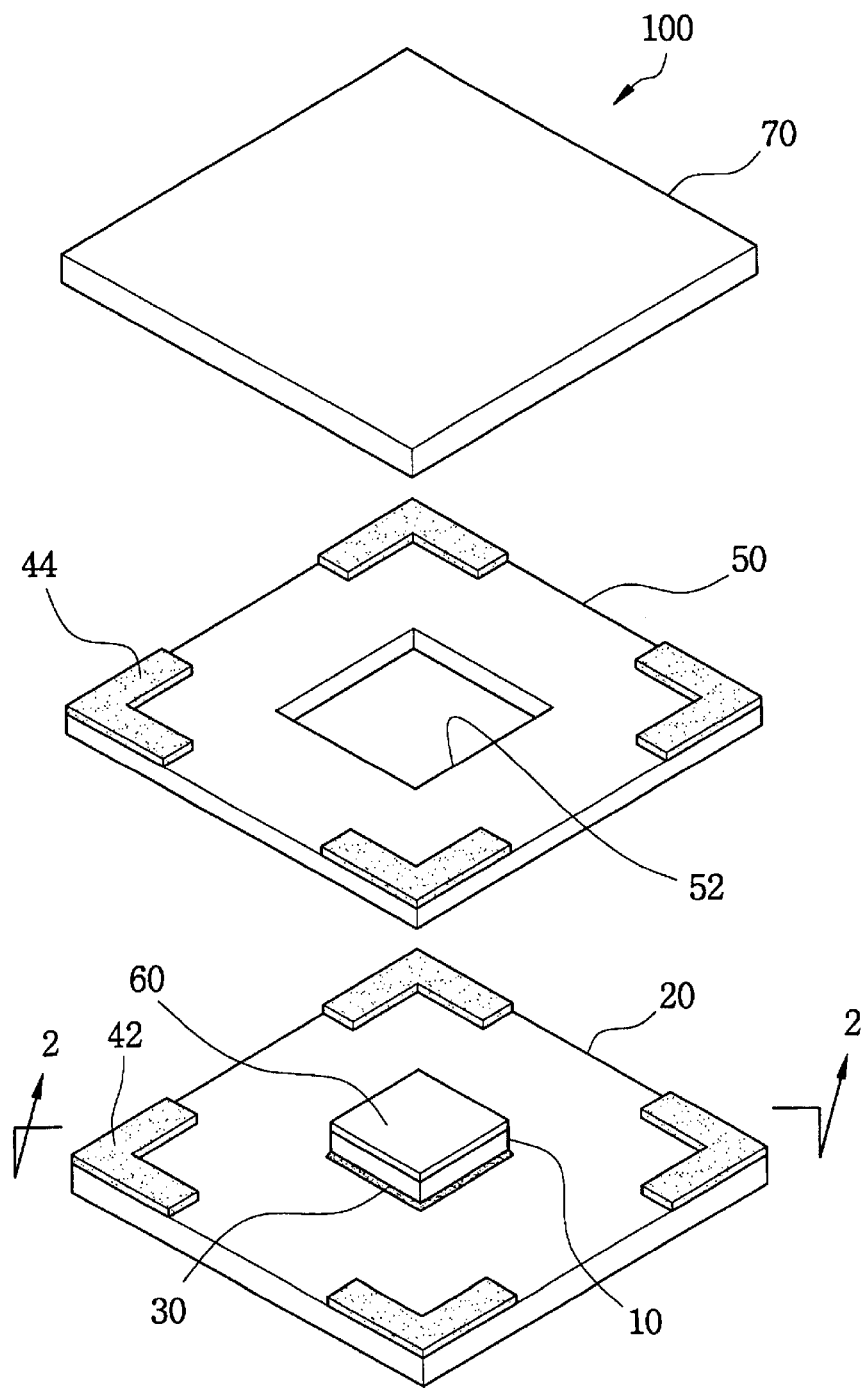
FIG. 1 is a perspective view of a conventional semiconductor package.
Figure 2:
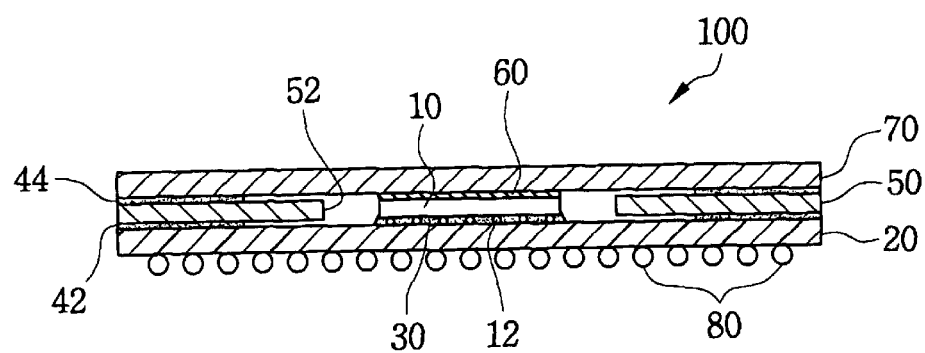
FIG. 2 is a cross-sectional view taken along line 2—2 of FIG. 1.
Figure 8:
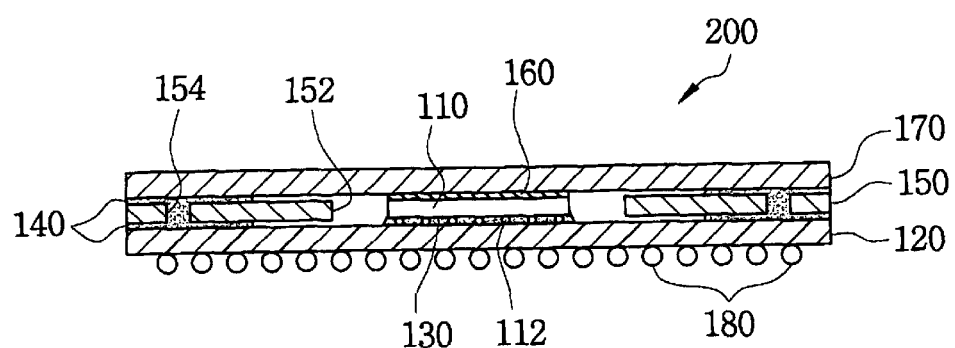
FIG. 8 is a cross-sectional view of the wiring board of FIG. 7 with solder balls.

As shown in FIG. 8, multiple external connection terminals 180 such as solder balls are formed on the lower surface of the wiring board 120. The solder balls may be formed by various methods such as a plating, a ball placement or a stencil printing, and a subsequent reflow process. An exemplary height of the external connection terminal is approximately 0.5 mm to 0.6 mm.

Figure 9:
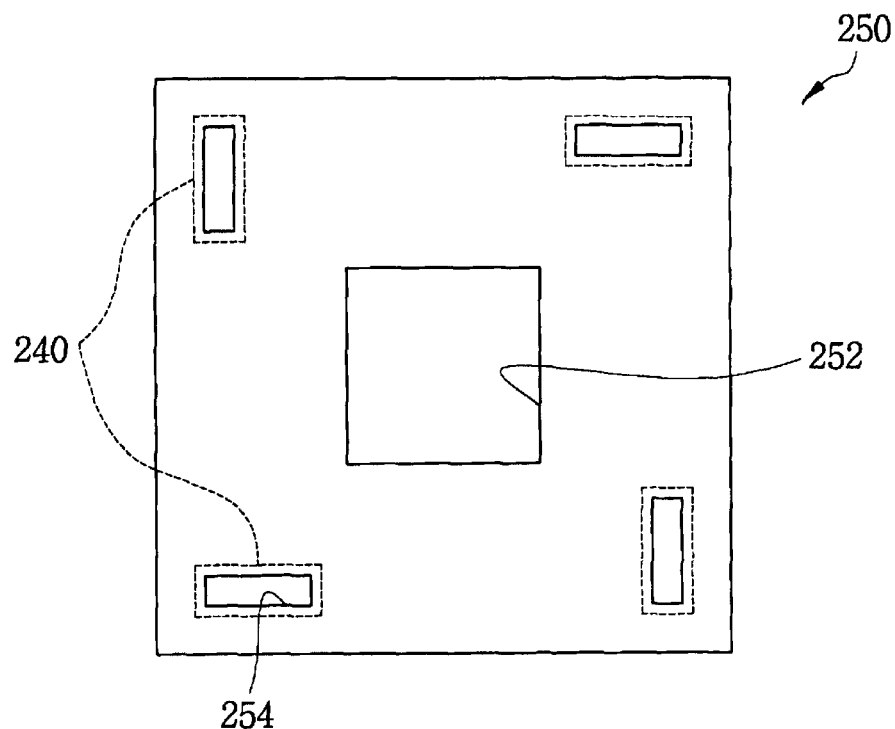
FIG. 9 is a plan view of a stiffener ring in accordance with another embodiment of the present invention.
Figure 10:
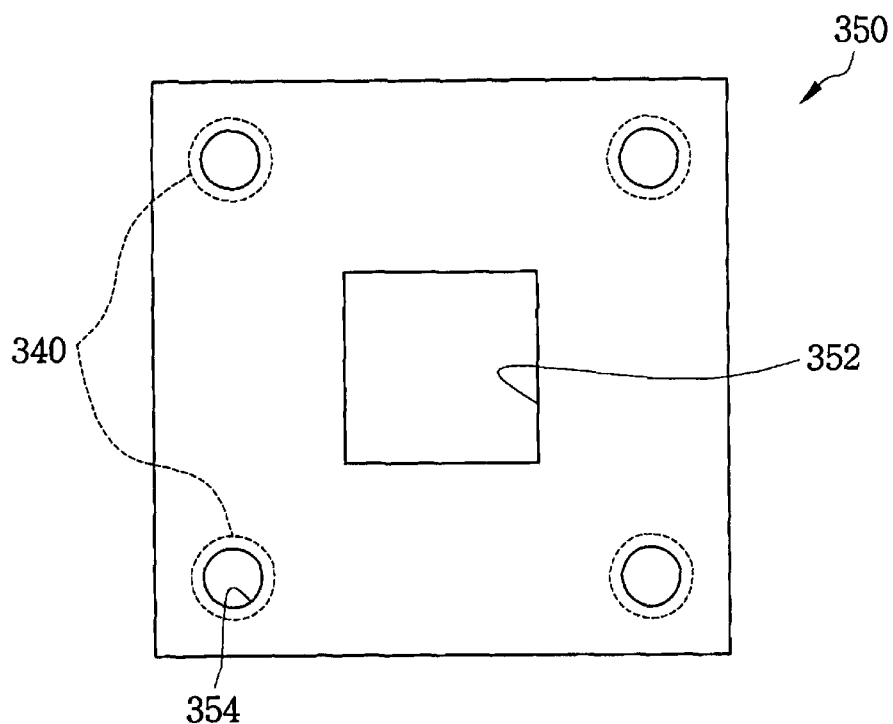
FIG. 10 is a plan view of a stiffener ring in accordance with still another embodiment of the present invention.

Although the above-described embodiment of the present invention uses the stiffener ring 150 with L-shaped through holes 154, as shown in FIGS. 9 and 10, other stiffener rings 250, 350 with various shaped through holes 254 and 354 may be also used. The stiffener ring 250 of FIG. 9 includes the through holes 254 in rectangular form at four corners, and the stiffener ring 350 of FIG. 10 includes the through holes 354 in circular form at four corners. Also, each through hole 254 or 354 has a smaller size than the adhesive 240 or 340. The adhesives 240 and 340 are shown as a dotted line in FIGS. 9 and 10. The through holes may be formed in other varied and modified forms.

In accordance with the embodiments of the present invention, the adhesive, which is coated on the upper surface of the wiring board, is partially squeezed onto the upper surface of the stiffener ring via the through holes of the stiffener ring by the downward pressing force of the stiffener ring, and then used to attach the heat spreader to the stiffener ring. Accordingly, the stiffener ring and the heat spreader are orderly attached to the wiring board by a single step of coating the adhesive on the wiring board.

Further, the through holes of the stiffener ring may serve as locking holes, thereby more firmly achieving attachments between the wiring board and the stiffener ring and between the stiffener ring and the heat spreader.

Although the specific embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A semiconductor package comprising:
   a wiring board having an upper surface and a lower surface;
   a semiconductor chip having a front surface and a back surface, the front surface being flip-chip bonded to the upper surface of the wiring board;
   an adhesive coated on the upper surface of the wiring board;
   a stiffener ring attached to the upper surface of the wiring board, wherein the stiffener ring comprises a window through which the semiconductor chip is exposed, and a plurality of through holes;
   a thermal interface material (TIM) coated on the back surface of the semiconductor chip;
   a heat spreader attached to the stiffener ring and the semiconductor chip, the stiffener ring being attached to the heat spreader by portions of the adhesive extending through the via holes and onto the upper surface of the stiffener ring, and the semiconductor chip being attached to the heat spreader by the TIM; and
   a plurality of external connection terminals positioned on the lower surface of the wiring board.

2. The semiconductor package of claim 1, wherein the stiffener ring has the same thickness as the semiconductor chip.

3. The semiconductor package of claim 1, wherein the adhesive is coated on a plurality of locations on the upper surface of the wiring board, wherein each of the through holes is formed corresponding to the locations of the adhesive.

4. The semiconductor package of claim 3, wherein the through holes are formed along edges of the stiffener ring.

5. A method for manufacturing a semiconductor package, the method comprising:
   preparing a wiring board having an upper surface and a lower surface;
   flip-chip bonding a semiconductor chip to the upper surface of the wiring board;
   coating an adhesive on the upper surface of the wiring board;
   attaching a stiffener ring to the upper surface of the wiring board, wherein the stiffener ring comprises a window through which the semiconductor chip is exposed, and a plurality of through holes;
   coating a thermal interface material (TIM) on the back surface of the semiconductor chip;
   attaching a heat spreader to the stiffener ring and the semiconductor chip, wherein the stiffener ring is attached to the heat spreader by portions of the adhesive squeezed onto the upper surface of the stiffener ring via the through holes, and the semiconductor chip is attached to the heat spreader by the TIM; and
   forming a plurality of external connection terminals on the lower surface of the wiring board.

6. The manufacturing method as claimed in claim 5, further comprising, after flip-chip bonding of the semiconductor chip, filling a space between the semiconductor chip and the wiring board with a polymeric material.

7. The manufacturing method as claimed in claim 5, wherein the stiffener ring has the same thickness as the flip-chip bonded semiconductor chip.

8. The manufacturing method as claimed in claim 5, wherein the adhesive is coated on a plurality of locations on the upper surface of the wiring board, wherein each of the through holes is formed corresponding to the locations of the adhesive.

9. The manufacturing method as claimed in claim 8, wherein the through holes are formed along edges of the stiffener ring.

* * * * *